US011753561B2

(12) United States Patent
Cheetham et al.

(10) Patent No.: US 11,753,561 B2
(45) Date of Patent: Sep. 12, 2023

(54) PATTERNING PASTE

(71) Applicant: PPG Industries Ohio, Inc., Cleveland, OH (US)

(72) Inventors: Paul F. Cheetham, Wexford, PA (US); Shawn R. DeBerry, Cranberry Township, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 41 days.

(21) Appl. No.: 16/766,432

(22) PCT Filed: Nov. 20, 2018

(86) PCT No.: PCT/US2018/061984
§ 371 (c)(1),
(2) Date: May 22, 2020

(87) PCT Pub. No.: WO2019/104022
PCT Pub. Date: May 31, 2019

(65) Prior Publication Data
US 2021/0032489 A1 Feb. 4, 2021

Related U.S. Application Data

(60) Provisional application No. 62/589,836, filed on Nov. 22, 2017.

(51) Int. Cl.
*C09D 11/52* (2014.01)
*C09D 11/037* (2014.01)
(Continued)

(52) U.S. Cl.
CPC .......... *C09D 11/52* (2013.01); *C09D 11/037* (2013.01); *C23F 1/02* (2013.01); *C23F 1/10* (2013.01);
(Continued)

(58) Field of Classification Search
CPC ... H05K 1/09; G06F 3/044; C23F 1/10; C23F 1/02; C09D 11/52; C09D 11/037
(Continued)

(56) References Cited

U.S. PATENT DOCUMENTS 3,716,514 A * 2/1973 Morello ................. H01B 3/306
524/195
2011/0253668 A1 10/2011 Winoto et al.
(Continued)

OTHER PUBLICATIONS

Lee et al., Japanese Patent Publication No. 2012-104427 (May 31, 2012) (Year: 2012).*

*Primary Examiner* — Tremesha S Willis
(74) *Attorney, Agent, or Firm* — Krisanne Shideler

(57) ABSTRACT

A patterning paste is disclosed for patterning metal nanowires, the patterning paste including a complexing agent containing guanidine thiocyanate. A method of selectively patterning a substrate having metal nanowires includes: providing a substrate having a surface bearing metal nanowires; and selectively applying the patterning paste to the substrate such that the metal nanowires are selectively cut into a pattern. A consumer electronic product includes: a substrate having a surface bearing metal nanowires. The metal nanowires of the substrate are selectively patterned by applying the patterning paste to the substrate such that the metal nanowires are selectively cut into the pattern.

14 Claims, 6 Drawing Sheets

(51) Int. Cl.
*C23F 1/02* (2006.01)
*C23F 1/10* (2006.01)
*G06F 3/044* (2006.01)
*H05K 1/09* (2006.01)
*H05K 3/06* (2006.01)
*H01Q 1/38* (2006.01)

(52) U.S. Cl.
CPC ............... *G06F 3/044* (2013.01); *H05K 1/09* (2013.01); *H05K 3/067* (2013.01); *G06F 2203/04102* (2013.01); *G06F 2203/04103* (2013.01); *G06F 2203/04112* (2013.01); *H01Q 1/38* (2013.01); *H05K 2201/0388* (2013.01); *H05K 2203/0545* (2013.01)

(58) Field of Classification Search
USPC ......................................................... 174/253
See application file for complete search history.

(56) References Cited

U.S. PATENT DOCUMENTS

2014/0021400 A1 1/2014 Coenjarts
2015/0359105 A1 12/2015 Yoon et al.

* cited by examiner

- "A" is the non-patterned area
- "B" is the etched area

PATTERNING PASTE

FIELD OF THE INVENTION

The present invention relates to a patterning paste for patterning metal nanowires, a method for selectively patterning a substrate having metal nanowires, and a consumer electronic product.

BACKGROUND OF THE INVENTION

Silver nanowire films are increasing in popularity as a possible replacement for indium tin oxide (ITO) in conductive films or for applications in which flexibility is an important consideration. Patterning of these silver nanowire films can slow down overall processing time. This is because current technologies either require complex patterning layers to be printed, selectively removed, and then etched before finally removing the mask or by waiting for lasers to etch out the pattern.

SUMMARY OF THE INVENTION

The present invention is directed to a patterning paste for patterning metal nanowires, the patterning paste including a complexing agent containing guanidine thiocyanate.

The present invention is also directed to a method of selectively patterning a substrate having metal nanowires including providing a substrate having a surface bearing metal nanowires. A patterning paste including a complexing agent containing guanidine thiocyanate is selectively applied to the substrate such that the metal nanowires are selectively cut into a pattern.

The present invention is also directed to a consumer electronic product including a substrate having a surface bearing metal nanowires. The metal nanowires of the substrate are selectively patterned by applying a patterning paste to the substrate such that the metal nanowires are selectively cut into the pattern. The patterning paste includes a complexing agent containing guanidine thiocyanate.

DESCRIPTION OF THE INVENTION

Figure 1:
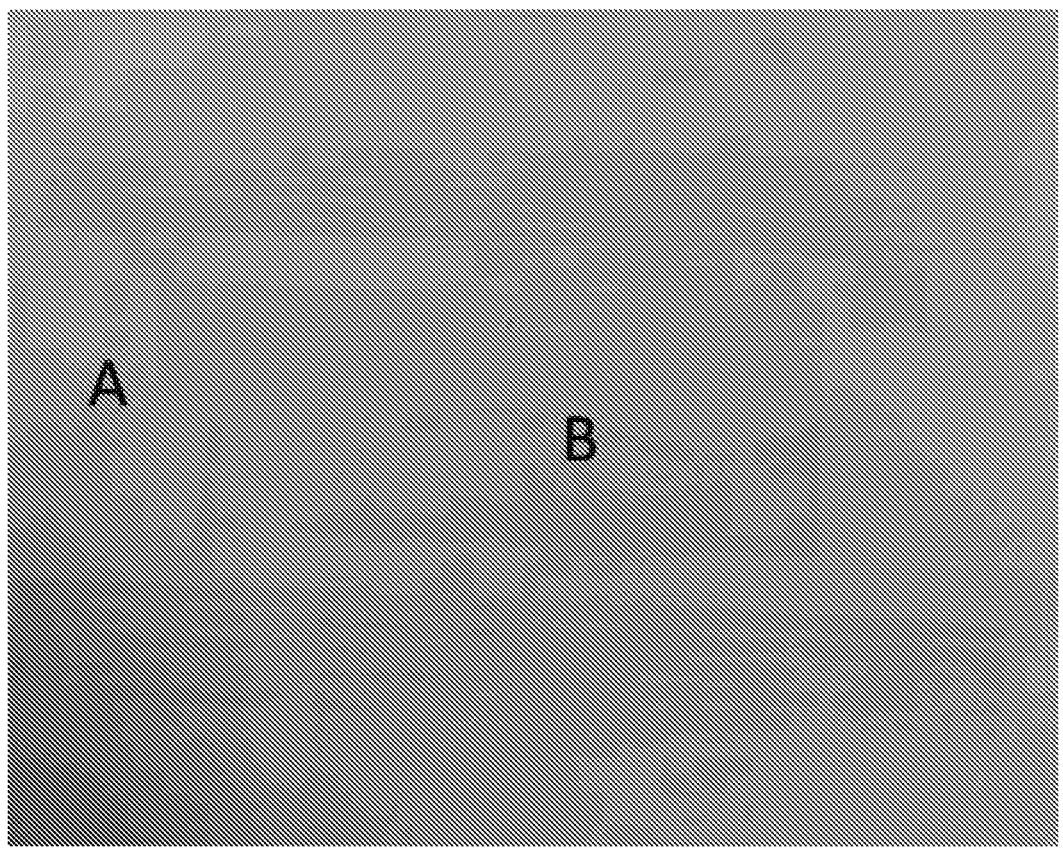
FIG. 1 shows an image of a substrate including metal nanowires which has been patterned using a patterning paste having potassium thiocyanate, the substrate having very visible patterning.

For purposes of the following detailed description, it is to be understood that the invention may assume various alternative variations and step sequences, except where expressly specified to the contrary. Moreover, other than in any operating examples, or where otherwise indicated, all numbers expressing, for example, quantities of ingredients used in the specification and claims are to be understood as being modified in all instances by the term "about". Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

In this application, the use of the singular includes the plural and plural encompasses singular, unless specifically stated otherwise. In addition, in this application, the use of "or" means "and/or" unless specifically stated otherwise, even though "and/or" may be explicitly used in certain instances. Further, in this application, the use of "a" or "an" means "at least one" unless specifically stated otherwise. For example, "an" amine, "a" complexing agent, and the like refer to one or more of these items. Also, as used herein, the term "polymer" may refer to prepolymers, oligomers, and both homopolymers and copolymers. The term "resin" is used interchangeably with "polymer."

As used herein, the transitional term "comprising" (and other comparable terms, e.g., "containing" and "including") is "open-ended" and open to the inclusion of unspecified matter. Although described in terms of "comprising", the terms "consisting essentially of" and "consisting of" are also within the scope of the invention.

The present invention is directed to a patterning paste for patterning metal nanowires, the patterning paste including a complexing agent including guanidine thiocyanate. The patterning paste may cut the metal nanowires by selectively degrading the metal nanowires to sever the nanowires in certain regions. This is carried out by the complexing agent creating a ligand/lixivant where it contacts the metal nanowires, which can then be washed from the substrate, resulting in the metal nanowires being cut. The portions of the cut nanowire may migrate or redeposit onto intact metal nanowires in the vicinity or migrate or redeposit as metal nanoparticles or other metal-containing structures.

Using guanidine thiocyanate as a complexing agent in the pattern paste offers advantages over patterning pastes that do not include guanidine thiocyanate as the complexing agent. Using amines, such as bis(hexamethylene) triamine and volatile organic compounds that evaporate during the activating or annealing operation do not work well as the sole complexing agent because silver released from the nanowires typically lays back down on the silver nanowire substrate causing unwanted areas of electrical isolation. Amines may include volatile organic compounds that evaporate during the activating or annealing operation, which then lay back down on the metal nanowire substrate, causing unwanted areas of electrical isolation. Thiocyanates are a salt and do not evaporate off of the silver nanowire substrate;

however, not all thiocyanates are equal in their effectiveness and certain thiocyanates have been found inferior to guanidine thiocyanate. For instance, potassium thiocyanate (KSCN) provides good silver nanowire isolation but is highly visible. FIG. 1 shows the highly visible patterning associated with using potassium thiocyanate as the sole complexing agent. Sodium thiocyanate also disadvantageously shows highly visible patterning. Ammonium thiosulfate provides overkill at conditions of 60° C. and 90% relative humidity. Further, ammonium thiocyanate provides no kill (does not even provide desired cutting) at 60° C. under other conditions. Sodium chloride (NaCl) provides no effect as a complexing agent, and sodium bromide (NaBr) impedes activation as a complexing agent. Polysulfide and ammonia may not provide localized cutting and tend to provide overkill.

As used herein, the term "nanowire" refers to an elongated, nano-sized object that is substantially solid. Typically, a nanowire has a lateral dimension (e.g., a cross-sectional dimension in the form of a width, a diameter, or a width or diameter that represents an average across orthogonal directions) in the nanometer (nm) range, a longitudinal dimension (e.g., a length) in the micron ($\mu$m) range, and an aspect ratio that is 3 or greater, such as 10 or greater. As used herein, the term "nano-sized" refers to the dimensions of an object that has at least one dimension in the nm range. As used herein, the term "nanometer range" or "nm range" refers to a range of dimensions from 1 nanometer ("nm") to 1 micron ($\mu$m).

The guanidine thiocyanate may be present in the patterning paste in an amount ranging from 1 to 35 weight percent, such as 1 to 30 weight percent, 1 to 25 weight percent, 1 to 20 weight percent, 1 to 15 weight percent, 1 to 10 weight percent, 4 to 15 weight percent, or 4 to 10 weight percent, based on the total weight of the patterning paste.

The guanidine thiocyanate may be present in the patterning paste in an amount ranging from 5 to 30 weight percent, such as 5 to 25 weight percent, 5 to 20 weight percent, 5 to 15 weight percent, 8 to 30 weight percent, 8 to 25 weight percent, 8 to 20 weight percent, 8 to 15 weight percent, 10 to 30 weight percent, 10 to 25 weight percent, 10 to 20 weight percent, 10 to 15 weight percent, 15 to 30 weight percent, 15 to 25 weight percent, or 15 to 20 weight percent, based on the total solids weight of the patterning paste.

Guanidine thiocyanate provides advantageous properties as a complexing agent because it is a known lixivant/ligand of certain metals, such as silver. Guanidine thiocyanate selectively cuts silver metal nanowires, in that the guanidine thiocyanate does not completely react at the process conditions, but leaves behind a small amount of metal nanowires to isolate the substrate electrically, while maintaining a small amount of residual metal nanowires so that the appearance of the substrate is not significantly affected to the naked eye.

The patterning paste may include further complexing agents in addition to guanidine thiocyanate. For example, the patterning paste may include an amine, such as bis (hexamethylene) triamine. While amines by themselves as complexing agents do not provide better results than guanidine thiocyanate by itself as the complexing agent (amines may cause unwanted areas of electrical isolation) a patterning paste containing both an amine and guanidine thiocyanate may be suitable for patterning metal nanowires. The amine concentration in the amine/guanidine thiocyanate composition may be kept low enough so that the amine does not result overkill to the metal nanowires, while advantageously imparting better visual properties to the substrate. Overkill is defined as the phenomenon of an unwanted spread of a patterning paste beyond an intended treatment area. The amine may be present in the patterning paste in an amount of up to 12 weight percent, based on the total weight of the patterning paste. The amine may be present in the patterning paste in an amount ranging from 0.1 to 12 weight percent, based on the total weight of the patterning paste.

Figure 2A:
FIGS. 2A-2B show scanning electron microscope images of a substrate including metal nanowires which has been patterned using a patterning paste containing guanidine thiocyanate (FIG. 2A) or guanidine thiocyanate and bis(hexamethylene) triamine (FIG. 2B)
Figure 2B:
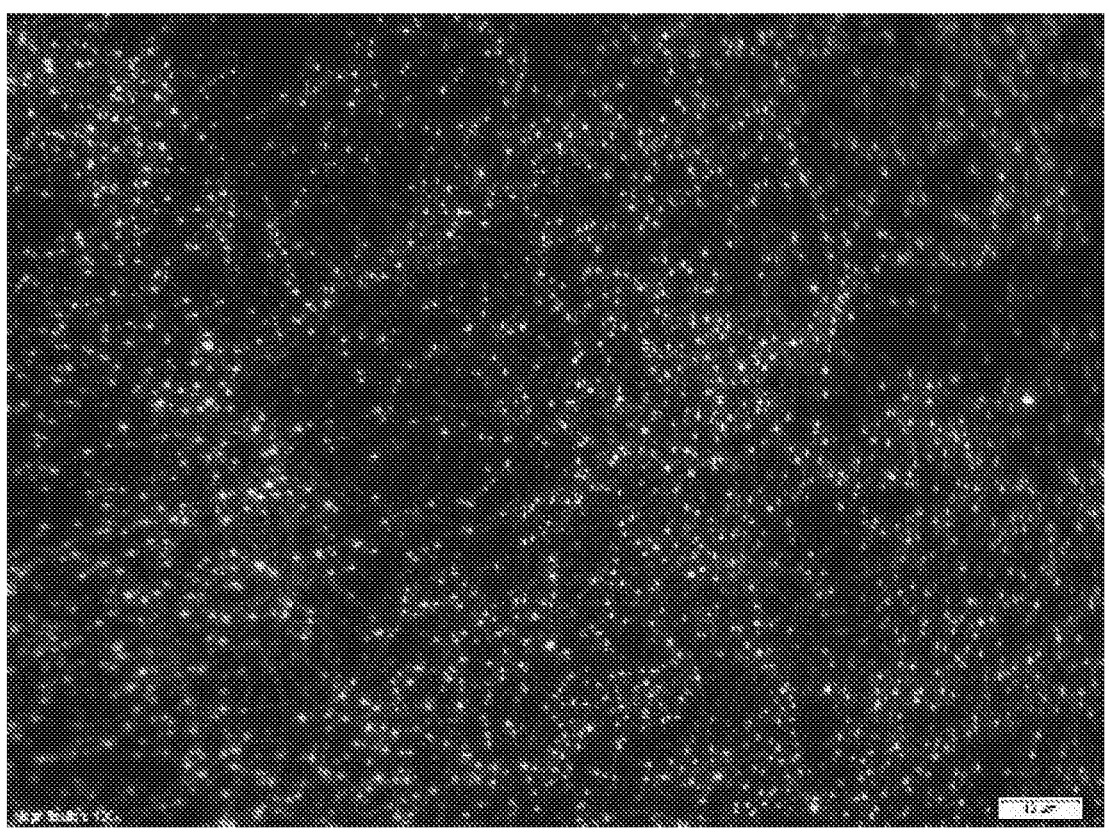

FIGS. 2A and 2B show results of substrates patterned using patterning paste including guanidine thiocyanate (FIG. 2A) or guanidine thiocyanate and bis(hexamethylene) triamine (FIG. 2B). FIG. 2B shows evidence silver re-deposition by the high number of bright spots in the image. Re-deposition of silver may provide advantageous index matching between the patterned areas and non-patterned areas of the substrate.

The complexing agent may include other components suitable for use as complexing agents in addition to the guanidine thiocyanate. Examples of suitable components that may be included as complexing agents (or as sources of complexing agents or ligands) include Group 15 element-containing (e.g., nitrogen-containing) compounds or Lewis bases, and may be in the form of, monomers, oligomers, and polymers that are terminated, derivatized, or substituted with one or more types of Group 15 element-containing functional groups or that include one or more Group 15 element atoms or Group 15 element-containing groups, such as in backbone structures of oligomers or polymers. Examples of suitable Group 15 element-containing compounds include organic and inorganic amines, such as ammonia, primary organic amines (cyclic or acyclic, unsaturated or saturated) and polyamines (linear, branched, or dendritic), secondary organic amines (cyclic or acyclic, unsaturated or saturated) and polyamines (linear, branched, or dendritic), and tertiary organic amines (cyclic or acyclic, unsaturated or saturated) and polyamines (linear, branched, or dendritic), such as polylysine, aziridine, aziridine-based compounds, derivatized aziridine-based compounds, polyethylenimine (linear, branched, or dendritic), and phosphorus, arsenic, antimony, and bismuth analogues of the foregoing compounds, as well as derivatized versions of the foregoing compounds.

Examples of suitable amines include those having the formula: $N(R)(R')(R'')$ where R, R', and R" are independently selected from a hydride, alkyl groups, alkenyl groups, alkynyl groups, aryl groups, such as linear or branched hydrocarbon groups (e.g., hydrocarbon groups including from 1-20, 1-15, 1-10, 1-8, or 1-5 carbon atoms), poly (alkylene oxide) groups, siloxane or polysiloxane groups, and derivatives thereof. Phosphorus, arsenic, antimony, and bismuth analogues of the foregoing compounds are also contemplated, such as where nitrogen is replaced by phosphorus, arsenic, antimony, or bismuth.

Examples of suitable polyamines include those having the formula: $R_2N((C_nR_{2n})_xNR)_a(C_mR_{2m})_yNR_2$, where R is a hydride group, an alkyl group, an alkenyl group, an alkynyl group, an aryl group, such as linear or branched hydrocarbon groups (e.g., hydrocarbon groups including from 1-20, 1-15, 1-10, 1-8, or 1-5 carbon atoms), a poly(alkylene oxide) group, a siloxane or a polysiloxane group, or a derivative thereof, and n, m, x, y, and a are integers each independently greater than or equal to 0 or greater than or equal to 1 (e.g., 0 or more, 1 or more, 2 or more, 3 or more, 4 or more, 5 or more, or 6 or more). The formula also can be generalized as $RR'N((C_nR''_{2n})_xNR''')_a(C_nR''''_{2m})_yNR'''''R''''''$, where the various R groups are independently selected from hydride groups, alkyl groups, alkenyl groups, alkynyl groups, aryl groups, such as linear or branched hydrocarbon groups (e.g., hydrocarbon groups including from 1-20, 1-15, 1-10, 1-8, or 1-5 carbon atoms), poly(alkylene oxide) groups, siloxane or polysiloxane groups, and derivatives thereof, and n, m, x, y, and a are integers each independently greater than or equal to 0 or greater than or equal to 1 (e.g., 0 or more, 1 or more, 2 or more, 3 or more, 4 or more, 5 or more, or 6 or more). Additional examples of suitable polyamines include those having the formula: RR'N—[(R")$_x$—NR'"—(R"")$_y$]$_z$—NR""'R""", where the R, R', R'", R"", and R""' groups are independently selected from hydride groups, alkyl groups, alkenyl groups, alkynyl groups, aryl groups, such as linear or branched hydrocarbon groups (e.g., hydrocarbon groups including from 1-20, 1-15, 1-10, 1-8, or 1-5 carbon atoms), poly(alkylene oxide) groups, siloxane or polysiloxane groups, and derivatives thereof, and the R" and R"" groups are independently selected from alkylene groups (e.g., methylene or —CH$_2$— and ethylene or —CH$_2$—CH$_2$—), alkenylene groups, alkynylene groups, arylene groups, such as linear or branched hydrocarbon groups (e.g., hydrocarbon groups including from 1-20, 1-15, 1-10, 1-8, or 1-5 carbon atoms), poly(alkylene oxide) groups, siloxane or polysiloxane groups, and derivatives thereof, and x, y, z are integers each independently greater than or equal to 0 or greater than or equal to 1 (e.g., 0 or more, 1 or more, 2 or more, 3 or more, 4 or more, 5 or more, or 6 or more). Phosphorus, arsenic, antimony, and bismuth analogues of the foregoing compounds are also contemplated, such as where at least one nitrogen in the foregoing formulas are replaced by phosphorus, arsenic, antimony, or bismuth.

Additional examples of suitable polyamines and Group 15 element analogues of polyamines include those having the formula:

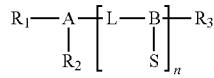

where $R_1$, $R_2$, $R_3$, and S are independently selected from hydride groups, alkyl groups, alkenyl groups, alkynyl groups, aryl groups, such as linear or branched hydrocarbon groups (e.g., hydrocarbon groups including from 1-20, 1-15, 1-10, 1-8, or 1-5 carbon atoms), poly(alkylene oxide) groups, siloxane or polysiloxane groups, and derivatives thereof, L is selected from alkylene groups, alkenylene groups, alkynylene groups, arylene groups, such as linear or branched hydrocarbon groups (e.g., hydrocarbon groups including from 1-20, 1-15, 1-10, 1-8, or 1-5 carbon atoms), poly(alkylene oxide) groups, siloxane or polysiloxane groups, and derivatives thereof, A and B are independently selected from nitrogen, phosphorus, arsenic, antimony, and bismuth, and n is an integer greater than or equal to 0 or greater than or equal to 1 (e.g., 0 or more, 1 or more, 2 or more, 3 or more, 4 or more, 5 or more, or 6 or more), and where for n>1:

L in different ones of the n units can be the same or different, and are independently selected from alkylene groups, alkenylene groups, alkynylene groups, arylene groups, such as linear or branched hydrocarbon groups, poly(alkylene oxide) groups, siloxane or polysiloxane groups, and derivatives thereof, S in different ones of the n units can be the same or different, and are independently selected from hydride groups, alkyl groups, alkenyl groups, alkynyl groups, aryl groups, such as linear or branched hydrocarbon groups, poly(alkylene oxide) groups, siloxane or polysiloxane groups, and derivatives thereof, and B in different ones of the n units can be the same or different, and are independently selected from nitrogen, phosphorus, arsenic, antimony, and bismuth.

Specific examples of amines and polyamines include ammonia, ethylenediamine (or H$_2$N—(CH$_2$)$_2$—NH$_2$), diethylenetriamine (or H$_2$N—(CH$_2$)$_2$—NH—(CH$_2$)$_2$—NH$_2$), octylamine (or CH$_3$—(CH$_2$)$_7$—NH$_2$), decylamine (or CH$_3$—(CH$_2$)$_9$—NH$_2$), triethylenetetraamine (or H$_2$N—(CH$_2$)$_2$—NH—(CH$_2$)$_2$—NH—(CH$_2$)$_2$—NH2), N-methylethylenediamine (or CH$_3$—NH—(CH$_2$)$_2$—NH$_2$), N,N'-dimethylethylenediamine (or (CH$_3$)$_2$N—(CH$_2$)$_2$—NH$_2$), N,N,N'-trimethylethylenediamine (or CH$_3$—NH—(CH$_2$)$_2$—N(CH$_3$)$_2$), N,N'-diisopropylethylenediamine (or (CH$_3$)$_2$CH—NH—(CH$_2$)$_2$—N—CH(CH$_3$)$_2$), and tetraethylpentaamine (or H$_2$N—(CH$_2$)$_2$—NH—(CH$_2$)$_2$—NH—(CH$_2$)$_2$—NH—(CH$_2$)$_2$—NH$_2$). Other specific examples of amines and polyamines include ethylenediamine tetraacetic acid, imidazoles (e.g., di-imidazole and tri-imidazole), pyrimidine, purine, spermine, urea, lysine, ethanolamine hydrochloride, hydantoin, thiourea, and amine-oxides (or oxidized amines). Further examples include aminated polymers, such as poly(vinylamine) and related copolymers. In some embodiments, suitable amines and polyamines include those lacking a carboxy group (or lacking a carbonyl group or lacking —(C=S)—), or including no more than 2 carboxy groups per molecule (or no more than 2 carbonyl groups or no more than 2 —(C=S)— per molecule), or no more than 1 carboxy group per molecule (or no more than 1 carbonyl group or no more than 1 —(C=S)— per molecule).

Additional specific examples of polyamines include polyethylenimine, which also can be referred to as polyaziridine or poly(iminoethylene). Polyethylenimine may be used in several molecular weights, may be branched, linear, or dendritic, and may be used as derivatives, such as polyethylenimine derivatized with various side chains or functional groups. Suitable molecular weights for polyethylenimine include 800 and 25,000 (number or weight average), although other molecular weights are contemplated, such as 100,000 or less, 50,000 or less, 25,000 or less, 20,000 or less, 10,000 or less, 5,000 or less, or 1,000 or less, and down to 500 or less.

Further examples of components that may act as complexing agents include transition metal or ammonium halides (e.g., silver halides such as silver chloride or silver bromide), transition metal or ammonium oxides (e.g., silver oxide), transition metal or ammonium sulfides (e.g., silver sulfide), other silver (e.g., Ag$^+$)-containing chemical agents, alkali metal (e.g., sodium or potassium) or ammonium thiocyanates, alkali metal (e.g., sodium or potassium), or ammonium polysulfides, alkali metal (e.g., sodium or potassium) sulfides, alkali metal (e.g., sodium or potassium), or ammonium thiosulfates, alkali metal (e.g., sodium or potassium) halides (e.g., chloride or bromide), metal or ammonium cyanides, ammonium carbonate, and ammonium carbamate.

The patterning paste may further include a carrier. The carrier may include a thickener. The thickener may be present in the pattering paste in an amount of up to 10 weight percent, such as up to 6 weight percent, up to 5 weight percent, up to 4 weight percent, up to 3 weight percent, up to 2 weight percent, or up to 1 weight percent, based on total weight of the patterning paste. The thickener may include 2-hydroxyethyl cellulose. However, other thickeners may be used, such as hydroxyl ethyl cellulose, methyl cellulose, ethyl methyl cellulose, alkali swellable emulsions, HEUR thickeners (nonionic polyurethane associative thickeners), and clays. Combinations of these thickeners may be used.

The thickener may include polymer binders, including water-soluble polymer binders such as poly(vinylpyrrolidone), polyvinyl alcohol, poly(vinyl alcohol-co-vinylamine), ethylene-vinyl alcohol copolymer, sodium polyacrylate, and carbohydrates, such as water-soluble cellulose derivatives like sodium carboxymethylcellulose, and water-soluble natural polymers like starch, starch paste, soluble starch, and dextrin. Polystyrene may also be a suitable thickener.

The carrier may also include a solvent. The solvent may include a humectant to keep the complexing agent in solution (e.g., a humectant that also functions as a solvent). As used herein, a "humectant" refers to a material used to retain moisture. Humectants may be included in the patterning paste that do not function as a solvent. The humectant may include ethylene glycol, propylene glycol, honey, butylene glycol, glycerin, urea, tremella extract, sodium lactate, sorbitol, sodium salt of pyrrolidone carbonic acid, and combinations thereof. The humectant may be present in the patterning paste in an amount of up to 50 weight percent, such as up to 45 weight percent, up to 40 weight percent, or up to 35 weight percent, based on the total weight of the patterning paste. The humectant may be present in the patterning paste in an amount ranging from 1 to 50 weight percent, such as from 10 to 45 weight percent, 15 to 40 weight percent, 20 to 35.

The patterning paste may further include an inert filler, such as barium sulfate, kaolin clay, titanium dioxide, hollow spheres, silicas, micas, or any other material that provides bulk to the patterning paste, imparts advantageous rheological properties, and/or is non-reactive with the metal nanowires.

The patterning paste may further include a wetting agent to adjust the formulation to specific surface tensions of the metal nanowire films.

The patterning paste may be applied to a substrate having a surface being covered with metal nanowires. The substrate may have any shape and size and may be transparent, translucent, or opaque. The substrate may be flexible, bendable, foldable, stretchable, or rigid. The substrate may be electrically conductive, semiconductive, or insulating.

Examples of suitable materials for the substrate include organic materials, inorganic materials, and hybrid organic-inorganic materials. For example, the substrate may include a thermoplastic polymer, a thermoset polymer, an elastomer, or a copolymer or other combination thereof, such as selected from polyolefins (e.g., polyethylene (or PE), polypropylene (or PP), polybutene, and polyisobutene), acrylate polymers (e.g., poly(methyl methacrylate) (or PMMA) type 1 and type 2), polymers based on cyclic olefins (e.g., cyclic olefin polymers (or COPs) and copolymers (or COCs), such as available under the trademark ARTON and ZEONOR-FILM), aromatic polymers (e.g., polystyrene), polycarbonate (or PC), ethylene vinyl acetate (or EVA), ionomers, polyvinyl butyral (or PVB), polyesters, polysulphones, polyamides, polyimides, polyurethanes, vinyl polymers (e.g., polyvinyl chloride (or PVC)), fluoropolymers, polysulfones, polylactic acid, polymers based on allyl diglycol carbonate, nitrile-based polymers, acrylonitrile butadiene styrene (or ABS), cellulose triacetate (or TAC), phenoxy-based polymers, phenylene ether/oxide, a plastisol, an organosol, a plastarch material, a polyacetal, aromatic polyamides, polyamide-imide, polyarylether, polyetherimide, polyarylsulfones, polybutylene, polyketone, polymethylpentene, polyphenylene, polymers based on styrene maleic anhydride, polymers based on polyallyl diglycol carbonate monomer, bismaleimide-based polymers, polyallyl phthalate, thermoplastic polyurethane, high density polyethylene, low density polyethylene, copolyesters (e.g., available under the trademark TRITAN), polyethylene terephthalate glycol (or PETG), polyethylene terephthalate (or PET), epoxy, epoxy-containing resin, melamine-based polymers, silicone and other silicon-containing polymers (e.g., polysilanes and polysilsesquioxanes), polymers based on acetates, polypropylene fumarate), poly(vinylidene fluoride-trifluoroethylene), poly-3-hydroxybutyrate polyesters, polycaprolactone, polyglycolic acid (or PGA), polyglycolide, polyphenylene vinylene, electrically conductive polymers, liquid crystal polymers, poly(methyl methacrylate) copolymer, tetrafluoroethylene-based polymers, sulfonated tetrafluoroethylene copolymers, fluorinated ionomers, polymer corresponding to, or included in, polymer electrolyte membranes, ethanesulfonyl fluoride-based polymers, polymers based on 2-[1-[difluoro-[(trifluoroethenyl)oxy]methyl]-1,2,2,2-tetrafluoroethoxy]-1,1,2,2,-tetrafluoro-, with tetrafluoro ethylene, tetrafluoroethylene-perfluoro-3,6-dioxa-4-methyl-7-octene-sulfonic acid copolymer, polyisoprene, polyglycolide, polyglycolic acid, polycaprolactone, polymers based on vinylidene fluoride, polymers based on trifluoroethylene, poly(vinylidene fluoride-trifluoroethylene), poly(phenylene vinylene), polymers based on copper phthalocyanine, cellophane, cuprammonium-based polymers, rayon, and biopolymers (e.g., cellulose acetate (or CA), cellulose acetate butyrate (or CAB), cellulose acetate propionate (or CAP), cellulose propionate (or CP), polymers based on urea, wood, collagen, keratin, elastin, nitrocellulose, plastarch, celluloid, bamboo, bio-derived polyethylene, carbodiimide, cartilage, cellulose nitrate, cellulose, chitin, chitosan, connective tissue, copper phthalocyanine, cotton cellulose, elastin, glycosaminoglycans, linen, hyaluronic acid, nitrocellulose, paper, parchment, plastarch, starch, starch-based plastics, vinylidene fluoride, and viscose), or any monomer, copolymer, blend, or other combination thereof. Additional examples of suitable substrates include ceramics, such as dielectric or non-conductive ceramics (e.g., $SiO_2$-based glass; $SiO_x$-based glass; $TiO_x$-based glass; other titanium, cerium, and magnesium analogues of $SiO_x$-based glass; spin-on glass; glass formed from sol-gel processing, silane precursor, siloxane precursor, silicate precursor, tetraethyl orthosilicate, silane, siloxane, phosphosilicates, spin-on glass, silicates, sodium silicate, potassium silicate, a glass precursor, a ceramic precursor, silsesquioxane, metallasilsesquioxanes, polyhedral oligomeric silsesquioxanes, halosilane, sol-gel, silicon-oxygen hydrides, silicones, stannoxanes, silathianes, silazanes, polysilazanes, metallocene, titanocene dichloride, vanadocene dichloride; and other types of glasses), conductive ceramics (e.g., conductive oxides and chalcogenides that are optionally doped and transparent, such as metal oxides and chalcogenides that are optionally doped and transparent), and any combination thereof. Additional examples of suitable substrates include electrically conductive materials and semiconductors, such as electrically conductive polymers like poly(aniline), PEDOT, PSS, PEDOT-PSS, and so forth. The substrate may be, for example, n-doped, p-doped, or un-doped. Further examples of substrate materials include polymer-ceramic composite, polymer-wood composite, polymer-carbon composite (e.g., formed of ketjen black, activated carbon, carbon black, graphene, and other forms of carbon), polymer-metal composite, polymer-oxide, or any combination thereof. The substrate material may also incorporate a reducing agent, a corrosion inhibitor, a moisture barrier material, or other organic or inorganic chemical agent (e.g., PMMA with ascorbic acid, COP with a moisture barrier material, or PMMA with a disulfide-type corrosion inhibitor).

The substrates bearing metal nanowires may be used as transparent conductors or other types of devices. The substrate may exhibit improved performance (e.g., higher electrical and thermal conductivity and higher light transmittance), as well as provide cost benefits arising from their composition and manufacturing methods. The substrates may be manufactured by a surface embedding process in which the metal nanowires are physically embedded into the substrate, while preserving desired characteristics of the substrate (e.g., transparency) and imparting additional desired characteristics to the resulting substrates (e.g., electrical conductivity). The metal nanowires may be embedded into the substrate by embedding the metal nanowire into a dry composition or embedding the metal nanowires in a wet composition, with varying degrees of wetness between fully dry and fully wet (a continuum between fully dry and fully wet). Substrates may be manufactured by other processes, such as an over-coating process.

The metal nanowires may include silver nanowires. The metal nanowires may be formed of a variety of other electrically conductive or semiconducting materials, including metals (e.g., nickel (or Ni), palladium (or Pd), platinum (or Pt), copper (or Cu), and gold (or Au)), metal alloys, semiconductors (e.g., silicon (or Si), indium phosphide (or InP), and gallium nitride (or GaN)), metalloids (e.g., tellurium (or Te)), conductive oxides and chalcogenides that are optionally doped and transparent (e.g., metal oxides and chalcogenides that are optionally doped and transparent, such as zinc oxide (or ZnO)), electrically conductive polymers (e.g., poly(aniline), poly(acetylene), poly(pyrrole), poly(thiophene), poly(p-phenylene sulfide), poly(p-phenylene vinylene), poly(3-alkylthiophene), olyindole, poly (pyrene), poly(carbazole), poly(azulene), poly(azepine), poly(fluorene), poly(naphthalene), melanins, poly(3,4-ethylenedioxy thiophene) (or PEDOT), poly(styrenesulfonate) (or PSS), PEDOT-PSS, PEDOT-poly(methacrylic acid), poly(3-hexylthiophene), poly(3-octylthiophene), poly(C-61-butyric acid-methyl ester), poly[2-methoxy-5-(2'-ethyl-hexyloxy)-1,4-phenylene vinylene]), and any combination thereof. Nanowires may have a core-shell configuration or a core-multi-shell configuration and may incorporate a metal halide shell or a metal oxide shell, or other metal halide or metal oxide portions.

Other structures may be used in place of or in combination with nanowires. Examples include nano-sized or micron-sized metal structures (or microstructures) in place of, or in combination with, nanowires. Non-limiting examples of suitable structures include printed or deposited metal mesh grids. The printed or deposited metal mesh grids may be single deposit alloys or dual deposits. The metal mesh grids may have a nano-sized diameter and be micron-sized in dimension or when fully sintered or printed, although the metal mesh grids need not be nano-sized. In general, the structures (e.g., nanostructures and microstructures) may be formed of a variety of materials, including metals, metal alloys, semiconductors, metalloids, conductive oxides and chalcogenides that are optionally doped and transparent, electrically conductive polymers, insulators, and any combination thereof. To impart electrical conductivity, nanostructures and microstructures may include an electrically conductive material, a semiconductor, or a combination thereof.

Examples of electrically conductive materials include metals (e.g., silver, copper, and gold in the form of silver nanowires, copper nanowires, and gold nanowires), silver-nickel, silver oxide, silver with a polymeric capping agent, silver-copper, copper-nickel, carbon-based materials (e.g., in the form of carbon nanotubes, graphene, and buckyballs), conductive ceramics (e.g., conductive oxides and chalcogenides that are optionally doped and transparent), electrically conductive polymers, and any combination thereof.

Examples of semiconductors include semiconducting polymers, Group IVB elements (e.g., carbon (or C), silicon (or Si), and germanium (or Ge)), Group IVB-IVB binary alloys (e.g., silicon carbide (or SiC) and silicon germanium (or SiGe)), Group IIB-VIB binary alloys (e.g., cadmium selenide (or CdSe), cadmium sulfide (or CdS), cadmium telluride (or CdTe), zinc oxide (or ZnO), zinc selenide (or ZnSe), zinc telluride (or ZnTe), and zinc sulfide (or ZnS)), Group IIB-VIB ternary alloys (e.g., cadmium zinc telluride (or CdZnTe), mercury cadmium telluride (or HgCdTe), mercury zinc telluride (or HgZnTe), and mercury zinc selenide (or HgZnSe)), Group IIIB-VB binary alloys (e.g., aluminum antimonide (or AlSb), aluminum arsenide (or AlAs), aluminium nitride (or AlN), aluminium phosphide (or AlP), boron nitride (or BN), boron phosphide (or BP), boron arsenide (or BAs), gallium antimonide (or GaSb), gallium arsenide (or GaAs), gallium nitride (or GaN), gallium phosphide (or GaP), indium antimonide (or InSb), indium arsenide (or InAs), indium nitride (or InN), and indium phosphide (or InP)), Group IIIB-VB ternary alloys (e.g., aluminium gallium arsenide (or AlGaAs or $Al_xGa_{1-x}As$), indium gallium arsenide (or InGaAs or $In_xGa_{1-x}As$), indium gallium phosphide (or InGaP), aluminium indium arsenide (or AlInAs), aluminium indium antimonide (or AlInSb), gallium arsenide nitride (or GaAsN), gallium arsenide phosphide (or GaAsP), aluminium gallium nitride (or AlGaN), aluminium gallium phosphide (or AlGaP), indium gallium nitride (or InGaN), indium arsenide antimonide (or InAsSb), and indium gallium antimonide (or InGaSb)), Group IIIB-VB quaternary alloys (e.g., aluminium gallium indium phosphide (or AlGaInP), aluminium gallium arsenide phosphide (or AlGaAsP), indium gallium arsenide phosphide (or InGaAsP), aluminium indium arsenide phosphide (or AlInAsP), aluminium gallium arsenide nitride (or AlGaAsN), indium gallium arsenide nitride (or InGaAsN), indium aluminium arsenide nitride (or InAlAsN), and gallium arsenide antimonide nitride (or GaAsSbN)), and Group IIIB-VB quinary alloys (e.g., gallium indium nitride arsenide antimonide (or GaInNAsSb) and gallium indium arsenide antimonide phosphide (or GaInAsSbP)), Group IB-VIIB binary alloys (e.g., cuprous chloride (or CuCl)), Group IVB-VIB binary alloys (e.g., lead selenide (or PbSe), lead sulfide (or PbS), lead telluride (or PbTe), tin sulfide (or SnS), and tin telluride (or SnTe)), Group IVB-VIB ternary alloys (e.g., lead tin telluride (or PbSnTe), thallium tin telluride (or $Tl_2SnTe_5$), and thallium germanium telluride (or $Tl_2GeTe_5$)), Group VB-VIB binary alloys (e.g., bismuth telluride (or $Bi_2Te_3$)), Group IIB-VB binary alloys (e.g., cadmium phosphide (or $Cd_3P_2$), cadmium arsenide (or $Cd_3As_2$), cadmium antimonide (or $Cd_3Sb_2$), zinc phosphide (or $Zn_3P_2$), zinc arsenide (or $Zn_3As_2$), and zinc antimonide (or $Zn_3Sb_2$)), and other binary, ternary, quaternary, or higher order alloys of Group IB (or Group 11) elements, Group IIB (or Group 12) elements, Group IIIB (or Group 13) elements, Group IVB (or Group 14) elements, Group VB (or Group 15) elements, Group VIB (or Group 16) elements, and Group VIIB (or Group 17) elements, such as copper indium gallium selenide (or CIGS), as well as any combination thereof.

Nanostructures and microstructures may include, for example, metallic or semiconducting nanoparticles, metallic or semiconducting nanowires (e.g., silver, copper, or zinc), metallic or semiconducting nanoplatelets, metallic or semiconducting nanorods, nanotubes (e.g., carbon nanotubes, multi-walled nanotubes ("MWNTs"), single-walled nanotubes ("SWNTs"), double-walled nanotubes ("DWNTs"), and graphitized or modified nanotubes), fullerenes, buckyballs, graphene, microparticles, microwires, microtubes, core-shell nanoparticles or microparticles, core-multi-shell nanoparticles or microparticles, core-shell nanowires, and other nano-sized or micron-sized structures having shapes that are generally or substantially tubular, cubic, spherical, or pyramidal, and characterized as amorphous, single or poly-crystalline, tetragonal, hexagonal, trigonal, orthorhombic, monoclinic, or triclinic, or any combination thereof.

Examples of core-shell nanoparticles and core-shell nanowires include those with a ferromagnetic core (e.g., iron, cobalt, nickel, manganese, as well as their oxides and alloys formed with one or more of these elements), with a shell formed of a metal, a metal alloy, a metal oxide, carbon, or any combination thereof (e.g., silver, copper, gold, platinum, a conductive oxide or chalcogenide, graphene, and other materials listed as suitable materials herein). A particular example of a core-shell nanowire is one with a silver core and a gold shell (or a platinum shell or another type of shell) surrounding the silver core to reduce or prevent oxidation of the silver core. Another example of a core-shell nanowire is one with a silver core (or a core formed of another metal or other electrically conductive material), with a shell or other coating formed of one or more of the following: (a) electrically conductive polymers, such as poly(3,4-ethylenedioxythiophene) (or PEDOT) and polyaniline (or PANI); (b) conductive oxides, chalcogenides, and ceramics (e.g., deposited by sol-gel, chemical vapor deposition, physical vapor deposition, plasma-enhanced chemical vapor deposition, or chemical bath deposition); (c) insulators in the form of ultra-thin layers, such as polymers, $SiO_2$, BaTiO, and $TiO_2$; and (d) thin layers of metals, such as gold, copper, nickel, chromium, molybdenum, and tungsten. Such coated or core-shell form of nanowires may be desirable to impart electrical conductivity, while avoiding or reducing adverse interactions with the substrate, such as potential yellowing or other discoloration in the presence of a metal such as silver, oxidation (e.g., a silver/gold core/shell nanowires may have substantially lower oxidation due to the gold shell), and sulfidation (e.g., a silver/platinum core/shell nanowire may have substantially lower sulfidation due to the platinum shell).

For certain implementations, high aspect ratio nanostructures are desirable, such as in the form of nanowires, nanotubes, and combinations thereof. For example, desirable nanostructures include nanotubes formed of carbon or other materials (e.g., MWNTs, SWNTs, graphitized MWNTs, graphitized SWNTs, modified MWNTs, modified SWNTs, and polymer-containing nanotubes), nanowires formed of a metal, a metal oxide, a metal alloy, or other materials (e.g., silver nanowires, copper nanowires, zinc oxide nanowires (undoped or doped by, for example, aluminum, boron, fluorine, and others), tin oxide nanowires (undoped or doped by, for example, fluorine), cadmium tin oxide nanowires, ITO nanowires, polymer-containing nanowires, and gold nanowires), as well as other materials that are electrically conductive or semiconducting and having a variety of shapes, whether cylindrical, spherical, pyramidal, or otherwise. Additional examples of suitable conductive structures include those formed of activated carbon, graphene, carbon black, or ketjen black, and nanoparticles formed of a metal, a metal oxide, a metal alloy, or other materials (e.g., silver nanoparticles, copper nanoparticles, zinc oxide nanoparticles, ITO nanoparticles, and gold nanoparticles).

The metal nanowires may be incorporated in single-layered or multi-layered substrates.

The metal nanowires may be embedded or otherwise incorporated in at least a portion of the substrate from 10% (or less, such as from 0.1%) by volume of the metal nanowire into an embedding surface and up to 100% by volume of the metal nanowire into the embedding surface, and may have metal nanowires exposed at varying surface area coverage, such as from 0.1% exposed surface area coverage (or less, such as 0% when an embedded region is entirely below the surface, or when the structures are completely encapsulated by the substrate) up to 99.9% (or more) exposed surface area coverage, such as from 0.1% to 10%, 0.1% to 8%, or 0.1% to 5% exposed surface area coverage. For example, in terms of a volume of a metal nanowire embedded below the embedding surface relative to a total volume of the structure, at least one metal nanowire may have an embedded volume percentage (or a population of the structures can have an average embedded volume percentage) in the range of 0% to 100%, such as from 10% to 50%, or from 50% to 100%.

The embedded region may have a thickness greater than a characteristic dimension of the metal nanowires used (e.g., greater than a diameter of an individual nanowire or an average diameter across the nanowires), with the metal nanowires largely or substantially confined to the embedded region and with the thickness less than an overall thickness of the substrate. For example, the thickness of the embedded region may be no greater than 95% of the overall thickness of the substrate, such as no greater than 80%, no greater than 75%, no greater than 50%, no greater than 40%, no greater than 30%, no greater than 20%, no greater than 10%, or no greater than 5% of the overall thickness.

The metal nanowires may be surface-embedded or otherwise incorporated in at least a portion of she substrate by varying degrees relative to a characteristic dimension of the metal nanowires used (e.g., relative to a diameter of an individual nanowire or an average diameter across the nanowires). For example, in terms of a distance of a furthest embedded point on a metal nanowire below an embedding surface, at least one metal nanowire may be embedded to an extent of more than 100% of the characteristic dimension, or may be embedded to an extent of not more than 100% of the characteristic dimension, such as at least 5% or 10% and up to 80%, up to 50%, or up to 25% of the characteristic dimension. As another example, a population of the metal nanowires, on average, may be embedded to an extent of more than 100% of the characteristic dimension, or may be embedded to an extent of not more than 100% of the characteristic dimension, such as at least 5% or 10% and up to 80%, up to 50%, or up to 25% of the characteristic dimension. As will be understood, the extent to which metal nanowires are embedded in the substrate may impact a roughness of an embedding surface, such as when measured as an extent of variation of heights across the embedding surface (e.g., a standard deviation relative to an average height). In some embodiments, a roughness of a surface-embedded substrate may be less than a characteristic dimension of embedded structures.

At least one nanowire may extend out from an embedding surface of the substrate from 0.1 nm to 1 cm, such as from 1 nm to 100 nm, from 1 nm to 50 nm, from 50 nm to 100 nm, or from 100 nm to 100 µm. In other examples, a population of nanowires, on average, may extend out from an embedding surface of the substrate from 0.1 nm to 1 cm, such as from 1 nm to 100 nm, from 1 nm to 50 nm, from 50 nm to 100 nm, or from 100 nm to 100 µm. In other examples, substantially all of a surface area of the substrate (e.g., an area of an embedding surface) may be covered or occupied by metal nanowires. In other examples, up to 100% or up to 75% of the surface area is covered or occupied by metal nanowires, such as up to 50% of the surface area, up to 25% of the surface area, up to 10%, up to 5%, up to than 3% of the surface area, or up to 1% of the surface area is covered by metal nanowires. Metal nanowires need not extend out from an embedding surface of the substrate, and may be localized entirely below the embedding surface. The degree of embedding and surface area coverage of metal nanowires in a substrate may be selected in accordance with a particular application.

The patterning paste may be selectively applied to the substrate such that the metal nanowires are selectively cut into a pattern. As used herein, pattern may refer to any predetermined arrangement of the silver nanowires. The patterning paste may be selectively applied to the substrate by screen printing methods (e.g., rotary screen printing). The patterning paste may be selectively applied to the substrate by first applying a mask to the substrate and then applying the patterning paste to the substrate, such that the masked regions are not contacted by the patterning paste, while the exposed regions are contacted by the patterning paste. The patterning paste may be selectively applied to the substrate slot die coating, flexographic printing, gravure printing, syringe dispense printing, and/or aerosol jet printing.

Optionally, an activating or annealing operation may be carried out to promote reaction or other activity of the patterning paste, such as through application of heat or other thermal or energizing treatment at a temperature above room temperature or above 25° C., at least 30° C., at least 40° C., at least 50° C., at least 60° C., at least 70° C., or at least 80° C., and up to 150° C., up to 140° C., up to 130° C., up to 120° C., up to 115° C., up to 110° C., or up to 100° C., and for a duration of at least 30 seconds, at least 45 seconds, at least 1 minute, at least 1.5 minutes, at least 2 minutes, at least 3 minutes, at least 4 minutes, or at least 5 minutes, and up to 2 hours, up to 1.5 hours, up to 1 hour, up to 50 minutes, up to 45 minutes, up to 40 minutes, up to 35 minutes, up to 30 minutes, up to 20 minutes, up to 10 minutes, up to 5 minutes, or up to 2 minutes. Optionally, a cleaning, washing, or rinsing operation may be carried out to remove any remaining patterning paste from the substrate, such as through the use of pressurized water or other suitable solvents, and a quenching operation may be carried out to quench further reaction or other activity of the patterning paste.

The patterned substrate may be used in consumer electronic products, such as circuit boards or antenna thereof. The patterned substrate may be used in, for example, solar cells (e.g., thin-film solar cells and crystalline silicon solar cells), display devices (e.g., flat panel displays, liquid crystal displays (or LCDs), plasma displays, organic light emitting diode (or OLED) displays, electronic-paper (or e-paper), quantum dot displays (e.g., QLED Displays), and flexible displays), solid-state lighting devices (e.g., OLED lighting devices), touch sensor devices (e.g., projected capacitive touch sensor devices, touch-on-glass sensor devices, touch-on-lens projected capacitive touch sensor devices, on-cell or in-cell projected capacitive touch sensor devices, self-capacitive touch sensor devices, surface capacitive touch sensor devices, and resistive touch sensor devices), smart windows (or other windows), windshields, aerospace transparencies, electromagnetic interference shields, charge dissipation shields, and anti-static shields, as well as other electronic, optical, optoelectronic, quantum, photovoltaic, and plasmonic devices. The substrate may be tuned or optimized depending on the particular application, such as work function matching in the context of photovoltaic devices or tuning of the substrate to form Ohmic contacts with other device components or layers.

Non-limiting examples of suitable electronic products include, but are not limited to electronic products including a touchscreen, such as mobile phone screens, table computer screens, computer screens, and the like.

The substrate may be used as electrodes in touch sensor devices. A touch sensor device is typically implemented as an interactive input device integrated with a display, which allows a user to provide inputs by contacting a touch screen. The touch screen is typically transparent to allow light and images to transmit through the device.

Adequate electrical isolation between conductive traces is desirable to isolate electrical signals to achieve spatial resolution in touch sensing or pixel switching. Adequate transparency of the patterned substrate is desirable to achieve higher display brightness, contrast ratio, image quality, and power consumption efficiency, while adequate electrical conductivity is desirable to maintain high signal-to-noise ratios, switching speeds, refresh rates, response time, and uniformity. For applications where electrical patterning is desirable but optically (e.g., visible to the human eye) observable patterning is undesirable, adequate pattern invisibility or low pattern visibility is desirable. Electrically isolated patterns that are nearly or substantially indistinguishable by the human eye are particularly desirable. Patterning methods that largely or substantially remove metal nanowires from portions of a substrate generally are not desirable because portions with material removed may be visually distinguished by the human eye from portions without material removal, either under typical room illumination or under high intensity light illumination, such as sunlight exposure or exposure to high intensity visible light from other sources. Additionally, a low-cost, solution-processable patterning method or composition is desired, such as to provide compatibility with ink-jet printing, screen printing, or gravure printing.

EXAMPLES

The following examples are presented to demonstrate the general principles of the invention. The invention should not be considered as limited to the specific examples presented. All parts and percentages in the examples are by weight unless otherwise indicated.

Example 1

A patterning paste was prepared by adding 7.24 grams of deionized water and 28.96 grams of ethylene glycol into a 10 ounce polypropylene container equipped with a stirrer. 4.24 grams of 2-hydroxyethyl cellulose (HEC) (viscosity average molecular weight (Mv)≈90,000) was incorporated via the stirrer. Once HEC was dissolved 10 grams of guanidine thiocyanate was incorporated via a stirrer and mixed until dissolved. 0.25 grams of SULFOPON 30 S03 was mixed in once the guanidine thiocyanate was dissolved. 0.57 grams of TEGO Airex 902 W was mixed in directly after the addition of the SULFOPON 30 S03. 48.74 grams of BLANC FIXE MICRO (barium sulfate) was mixed in until a homogenous dispersion of the mixture is observed. The material was then moved to a 3 roll mill and processed through the mill and placed into a new 10 ounce polypropylene container.

TABLE 1

| Component | Weight (grams) |
|---|---|
| Deionized water | 7.24 |
| Ethylene glycol[1] | 28.96 |
| 2-Hydroxyethyl cellulose[2] | 4.24 |
| SULFOPON 30 S03[3] | 0.25 |
| Guanidine thiocyanate[4] | 10.00 |
| BLANC FIXE MICRO[5] | 48.74 |
| TEGO AirEx 902W[6] | 0.57 |

Example 2

A patterning paste material was prepared by adding 7.65 grams of deionized water and 30.58 grams of ethylene glycol into a 10 ounce polypropylene container equipped with a stirrer. 4.48 grams of 2-hydroxyethyl cellulose (HEC) (viscosity average molecular weight (Mv)≈90,000) was incorporated via the stirrer. Once HEC was dissolved 4.97 grams of guanidine thiocyanate was incorporated a via stirrer and mixed until dissolved. 0.26 grams of DYNAX DX4005N was mixed in once the guanidine thiocyanate was dissolved. 0.60 grams of TEGO Airex 902 W was mixed in directly after the addition of the DYNAX DX4005N. 51.47 grams of BLANC FIXE MICRO (barium sulfate) was mixed in until a homogenous dispersion of the mixture is observed. The material was then moved to a 3 roll mill and processed through the mill and placed into a new 10 ounce polypropylene container.

TABLE 2

| Component | Weight (grams) |
|---|---|
| Deionized water | 7.65 |
| Ethylene glycol[1] | 30.58 |
| 2-Hydroxyethyl cellulose[2] | 4.48 |
| Guanidine thiocyanate[4] | 4.97 |
| TEGO AirEx 902W[6] | 0.60 |
| DYNAX DX4005[7] | 0.26 |
| BLANC FIXE MICRO[5] | 51.47 |

Figure 3A:
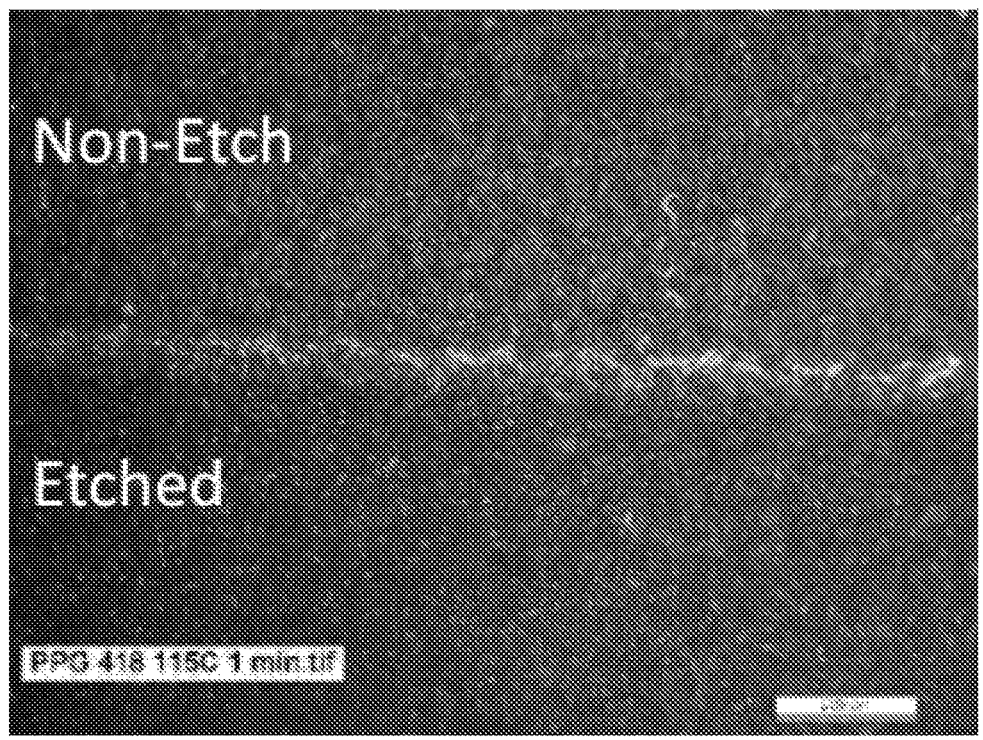
FIGS. 3A-3C show scanning electron microscope images of a substrate including metal nanowires which has been patterned using a patterning paste containing guanidine thiocyanate.
Figure 3B:
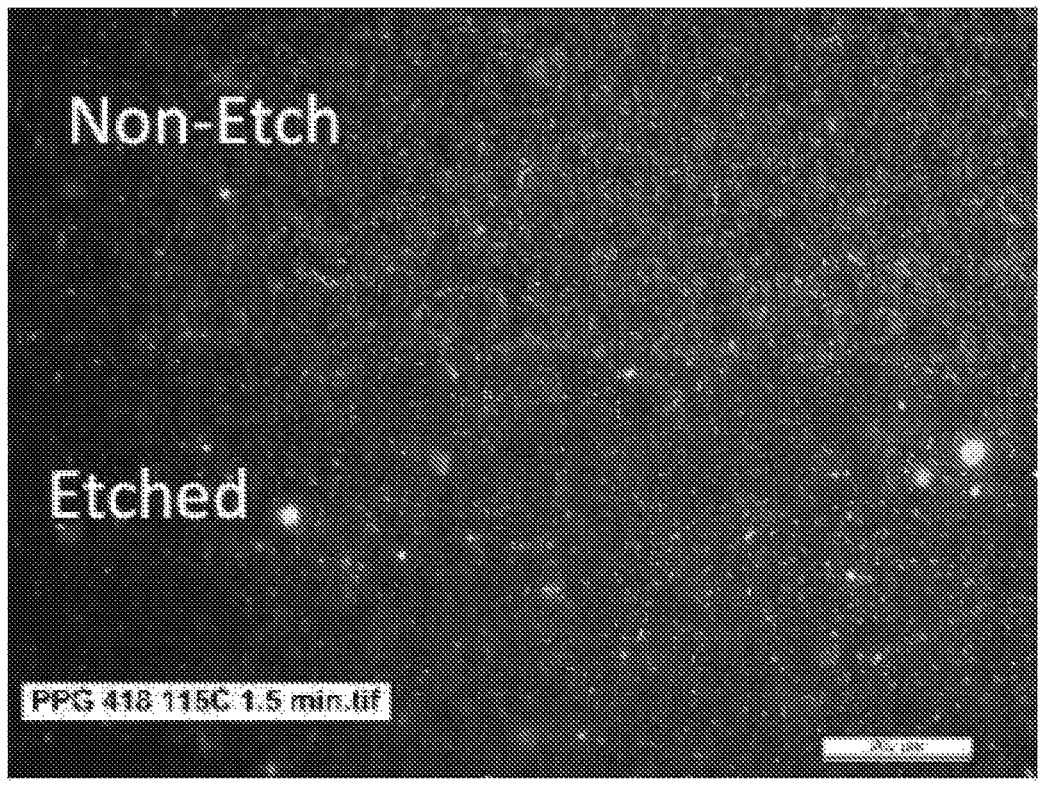
Figure 3C:
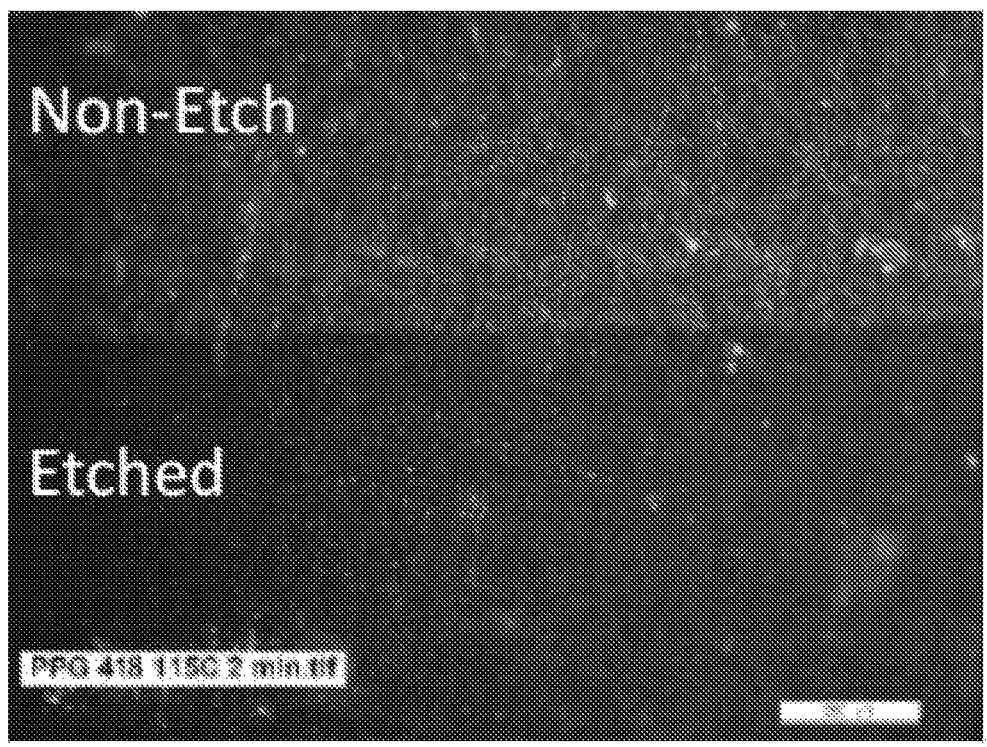

FIGS. 3A-3C show scanning electron microscope images of a substrate including metal nanowires which has been patterned using the patterning paste containing guanidine thiocyanate of Example 2. FIGS. 3A-3C show the substrate treated with the patterning paste of Example 2 and activated at 115° C. for 1 minute, 1.5 minutes, and 2 minutes, respectively. As can be seen, the amount of cutting achieved changes over time during activation. FIG. 3A shows some amount of cutting achieved at 1 minute, more cutting achieved after 1.5 minutes (FIG. 3B), and further cutting achieved after 2 minutes (FIG. 3C)

Table 3 below shows the compositional advantages of several components included in Examples 1 and 2.

TABLE 3

| Compositional Advantages | Test | Results |
|---|---|---|
| Ethylene glycol[1] | — | humectant, equilibrium with H$_2$O |
| 2-Hydroxyethyl cellulose[2] | Power wash panel | Water soluble/washable |
| Guanidine thiocyanate[4] | SEM, ohm-meter | No overkill, proven ligand/ lixivant for AgNW, provides great rheology |
| DYNAX DX4005[7] | Accudyne test | Lowers dynamic surface tension |
| BLANC FIXE MICRO[5] | Power wash panel | Environmentally friendly, particle filling rheological modifier |

Comparative Example 3

A patterning paste was prepared by adding 7.24 grams of deionized water and 28.96 grams of ethylene glycol into a 10 ounce polypropylene container equipped with a stirrer. 4.24 grams of 2-hydroxyethyl cellulose (HEC) (viscosity average molecular weight (Mv)≈90,000) was incorporated via the stirrer. Once HEC was dissolved 10 grams of potassium thiocyanate was incorporated via a stirrer and mixed until dissolved. 0.25 grams of SULFOPON 30 S03 was mixed in once the potassium thiocyanate was dissolved. 0.57 grams of TEGO Airex 902 W was mixed in directly after the addition of the SULFOPON 30 S03. 48.74 grams of BLANC FIXE MICRO (barium sulfate) was mixed in until a homogenous dispersion of the mixture is observed. The material was then moved to a 3 roll mill and processed through the mill and placed into a new 10 ounce polypropylene container.

TABLE 4

| Component | Weight (grams) |
|---|---|
| Deionized water | 7.24 |
| Ethylene glycol[1] | 28.96 |
| 2-Hydroxyethyl cellulose[2] | 4.24 |
| Potassium Thiocyanate | 10.00 |
| TEGO AirEx 902W[6] | 0.57 |
| Sulopon 30 S03[3] | 0.25 |
| BLANC FIXE MICRO[5] | 48.74 |

Two substrates (panels A and B) including metal nanowires were each patterned using the patterning paste of Comparative Example 3 in elongated parallels cells along a length of the panels and activated at 115° C. for 1.25 minutes. After a wash with deionized water and drying with a lint free cloth, the panels were tested for point to point resistance on a Fluke 189 multimeter. Electrical isolation measurements of resistances in ohms were conducted within one cell utilizing a point to point resistance measurement of each panel at 316.7 (panel A) and 260.5 (panel B). Between adjacent cells, the point to point resistance in ohms ranged 258.8-316.2 (panel A) and 247.2-296.5 (panel B). The electrical resistivity of panels A and B indicate that patterning paste using KSCN did not sever the metal nanowires as occurred for the patterning pastes of Examples 1 and 2 using guanidine thiocyanate at low temperatures.

The present invention further includes the subject matter of the following clauses:

Clause 1: A patterning paste for patterning metal nanowires, the patterning paste comprising a complexing agent comprising guanidine thiocyanate.

Clause 2: The patterning paste of clause 1, further comprising a carrier comprising: a thickener; and a solvent.

Clause 3: The patterning paste of clause 1 or 2, wherein the complexing agent further comprises an amine.

Clause 4: The patterning paste of clause 3, wherein the amine comprises bis(hexamethylene) triamine.

Clause 5: The patterning paste of clause 3 or 4, wherein the patterning paste comprises 0.1 to 12 weight percent of the amine, based on total weight of the patterning paste.

Clause 6: The patterning paste of any of the preceding clauses, wherein the patterning paste comprises 1 to 35 weight percent of the complexing agent, based on total weight of the patterning paste.

Clause 7: The patterning paste of any of clauses 2-6, wherein the patterning paste comprises a humectant, wherein the patterning paste comprises up to 50 weight percent of the humectant, based on total weight of the patterning paste.

Clause 8: The patterning paste of any of the preceding clauses, wherein the patterning paste cuts metal nanowires.

Clause 9: The patterning paste of clause 8, wherein the metal nanowires comprise silver, gold, copper, and/or nickel nanowires.

Clause 10: The patterning paste of any of clauses 2-9, wherein the patterning paste comprises up to 10 weight percent of the thickener, based on total weight of the patterning paste.

Clause 11: A method of selectively patterning a substrate comprising metal nanowires comprising: providing a substrate having a surface bearing metal nanowires; and selectively applying a patterning paste comprising a complexing agent comprising guanidine thiocyanate to the substrate such that the metal nanowires are selectively cut into a pattern.

Clause 12: The method of clause 11, further comprising: removing the patterning paste after the patterning paste is selectively applied to the substrate.

Clause 13: The method of clause 11 or 12, wherein the metal nanowires comprise silver nanowires.

Clause 14: The method of any of clauses 11-13, wherein the patterning paste is selectively applied to the substrate by screen printing.

Clause 15: The method of any of clauses 11-14, wherein a mask is applied to the substrate prior to selectively applying the patterning paste to the substrate.

Clause 16: A consumer electronic product comprising: a substrate having a surface bearing metal nanowires, wherein the metal nanowires of the substrate are selectively patterned by applying the patterning paste comprising a complexing agent comprising guanidine thiocyanate to the substrate such that the metal nanowires are selectively cut into a pattern.

Clause 17: The consumer electronic product of clause 16, wherein the complexing agent further comprises an amine.

Claus 18: The consumer electronic product of clause 16 or 17, wherein the metal nanowires comprise silver nanowires.

Clause 19: The consumer electronic product of any of clauses 16-18, wherein the substrate comprises a circuit board or an antenna.

Clause 20: The consumer electronic product of any of clauses 16-19, wherein the consumer electronic product comprises touchscreen.

Whereas particular embodiments of this invention have been described above for purposes of illustration, it will be evident to those skilled in the art that numerous variations of the details of the present invention may be made without departing from the invention as defined in the appended claims.

The invention claimed is:

1. A patterning paste for patterning metal nanowires, the patterning paste comprising a complexing agent comprising guanidine thiocyanate and a carrier comprising a humectant and a thickener, wherein the thickener comprises at least one of 2-hydroxyethyl cellulose, hydroxyl ethyl cellulose, methyl cellulose, ethyl methyl cellulose, alkali swellable emulsions, nonionic polyurethane associative thickeners, clays, poly(vinylpyrrolidone), polyvinyl alcohol, poly(vinyl alcohol-co-vinylamine), ethylene-vinyl alcohol copolymer, sodium polyacrylate, carboxymethylcellulose, starch, starch paste, soluble starch, dextrin, polystyrene, or a combination thereof.

2. The patterning paste of claim 1, wherein the complexing agent further comprises an amine.

3. The patterning paste of claim 2, wherein the amine comprises bis(hexamethylene) triamine.

4. The patterning paste of claim 2, wherein the patterning paste comprises 0.1 to 12 weight percent of the amine, based on total weight of the patterning paste.

5. The patterning paste of claim 1, wherein the patterning paste comprises 1 to 35 weight percent of the complexing agent, based on total weight of the patterning paste.

6. The patterning paste of claim 1, wherein the patterning paste comprises up to 50 weight percent of the humectant, based on total weight of the patterning paste.

7. The patterning paste of claim 1, wherein the patterning paste cuts metal nanowires.

8. The patterning paste of claim 7, wherein the metal nanowires comprise silver, gold, copper, and/or nickel nanowires.

9. The patterning paste of claim 1, wherein the patterning paste comprises up to 10 weight percent of the thickener, based on total weight of the patterning paste.

10. A method of selectively patterning a substrate comprising metal nanowires comprising:
    providing a substrate having a surface bearing metal nanowires; and
    selectively applying a patterning paste comprising a complexing agent comprising guanidine thiocyanate to the substrate such that the metal nanowires are selectively cut into a pattern.

11. The method of claim 10, further comprising:
    removing the patterning paste after the patterning paste is selectively applied to the substrate.

12. The method of claim 10, wherein the metal nanowires comprise silver nanowires.

13. The method of claim 10, wherein the patterning paste is selectively applied to the substrate by screen printing.

14. The method of claim 10, wherein a mask is applied to the substrate prior to selectively applying the patterning paste to the substrate.

* * * * *